United States Patent [19]

Trausch

[11] 4,404,060
[45] Sep. 13, 1983

[54] METHOD FOR PRODUCING INSULATING RING ZONES BY GALVANIC AND ETCH TECHNOLOGIES AT ORIFICE AREAS OF THROUGH-HOLES IN A PLATE

[75] Inventor: Güenter Trausch, Munich, Fed. Rep. of Germany

[73] Assignee: Siemens Aktiengesellschaft, Berlin & Munich, Fed. Rep. of Germany

[21] Appl. No.: 370,352

[22] Filed: Apr. 21, 1982

[30] Foreign Application Priority Data

May 8, 1981 [DE] Fed. Rep. of Germany ....... 3118335
Jan. 26, 1982 [DE] Fed. Rep. of Germany ....... 3202447

[51] Int. Cl.³ .......................... C23F 1/02; B44C 1/22; C03C 15/00; C03C 25/06
[52] U.S. Cl. ................... 156/632; 156/634; 156/656; 156/661.1; 204/15; 430/23; 430/321; 430/323
[58] Field of Search ................... 204/24, 25, 26, 32 R, 204/15; 427/230, 243, 97, 259, 264, 266, 270, 272; 430/23, 312, 313, 315, 318, 321, 323, 329, 330; 156/629–634, 644, 656, 659.1, 661.1; 313/217; 315/169 TV

[56] References Cited
U.S. PATENT DOCUMENTS 3,661,581 5/1972 Feldstein ........................... 430/23 X
4,240,869 12/1980 Diepers ............................ 204/24 X
4,342,821 8/1982 Galves et al. .................... 430/321 X

*Primary Examiner*—William A. Powell
*Attorney, Agent, or Firm*—Hill, Van Santen, Steadman & Simpson

[57] ABSTRACT

All surfaces of a plate having a select pattern of through-holes are coated with a thin metal layer, including the side walls of the through-holes. A layer of a negative dry resist is then laminated onto a plate surface adjacent and facing desired insulating ring zones in such a manner that a portion of the resist layer penetrates into the through-hole orifices. Subsequently, the resist layer portions within the orifices are irradiated with ultraviolet light directed through the through-holes from the surface thereof opposite that coated with the resist layer and then, optionally, another layer of dry resist is applied to this opposing plate surface. Thereafter the resist layer or layers on the plate are irradiated through an appropriate mask aligned relative to the through-hole pattern to define areas for electrodes and the non-irradiated resist areas are stripped-off with a developer. Subsequently, a metal layer is galvanically applied onto all uncovered metal surface areas, remaining resist areas are removed and the so-uncovered metal areas are etched away to define electrodes. The method is useful, for example, in producing elements for flat plasma picture screens.

9 Claims, 8 Drawing Figures

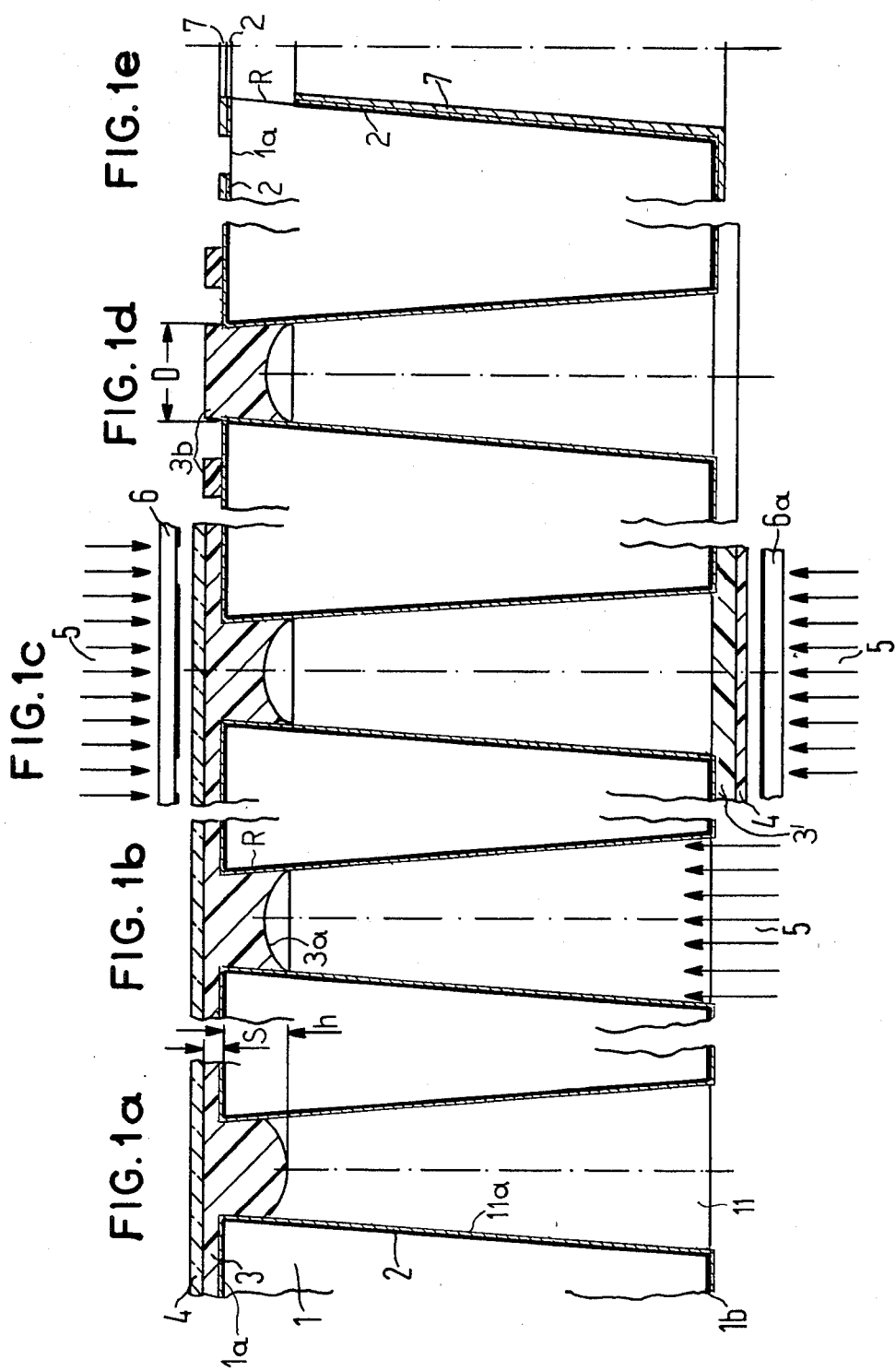

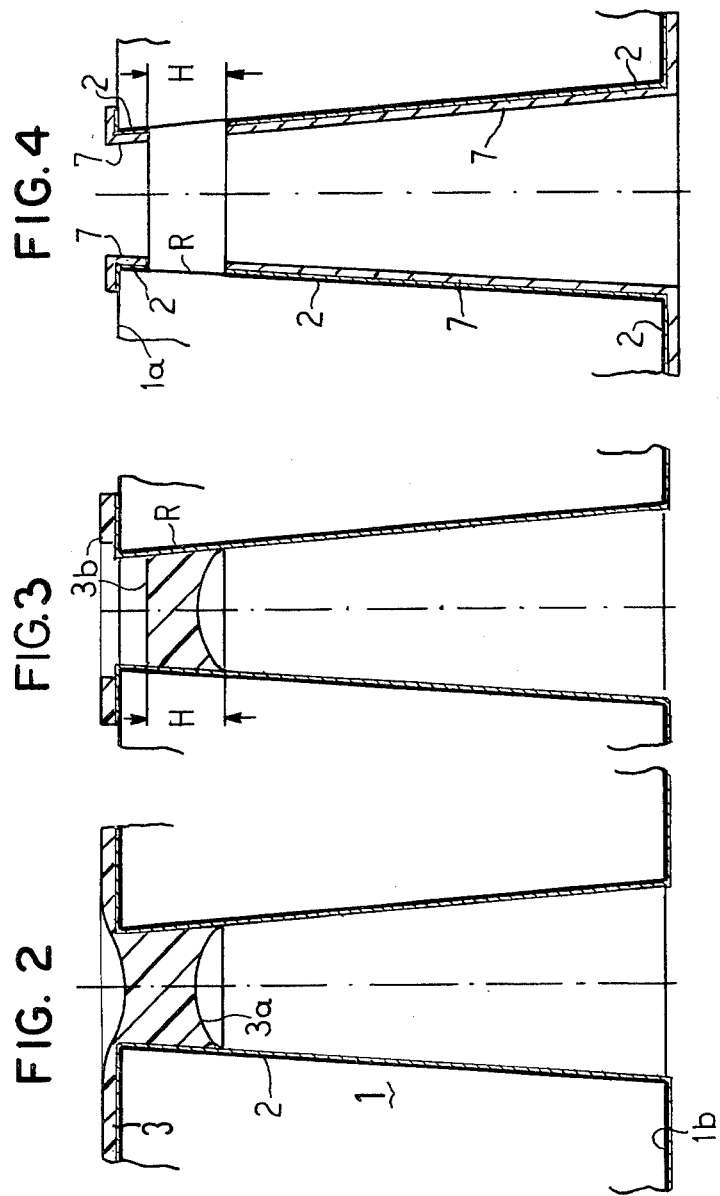

METHOD FOR PRODUCING INSULATING RING ZONES BY GALVANIC AND ETCH TECHNOLOGIES AT ORIFICE AREAS OF THROUGH-HOLES IN A PLATE

BACKGROUND OF THE INVENTION

1. Field of the Invention

The invention relates to optical-electrical image reproducing devices and somewhat more particularly to a method of producing insulating ring zone at orifice areas of through-holes in a plate useful in such devices.

2. Prior Art

In flat plasma picture screens, for example, such as disclosed in German Auslegechrift No. 24 12 869, corresponding to U.S. Pat. No. 3,956,667, electron flow from a plasma space to areas of luminscent material on a picture screen is regulated for each image point by an electrode matrix applied to a so-called control plate. This control plate is somewhat larger than the picture screen itself, consists of glass and is provided with through-holes corresponding to a desired pattern of image points and is coated on both sides with metallic electrode leads.

In order to improve control properties, two additional electrode levels (tetrode and pentode), which are located on a further glass plate, can be attached between the control plate and the picture screen. Both of these plates can consist of relatively thin glass layers (for example, 0.2 mm thick) or of a photoform glass layer (for example 1 mm thick) or a photoform glass layer and a thin glass layer can be combined.

With the use of photoform glass layers having through-holes therein, the hole walls must also be metallized. However, this metallization must be interrupted at a specific location for a relatively short distance in comparison to the hole depth so as to define an insulating ring zone. As a rule, such insulating ring zones should be located at the narrowest hole cross-section so that, with a photoform glass plate etched at both sides, the insulating ring lies along the center of the hole, and with single-sided etching, the insulating ring is located directly under the electrode level having the smaller hole orifice. As may be appreciated, the production of such insulating ring zones is difficult because of the fineness and multitude of through-holes.

SUMMARY OF THE INVENTION

The invention provides a method for producing such insulating ring zones with certainty in a select orifice area of a through-hole.

In accordance with the principles of the invention, the entire surface of a plate having a desired pattern of through-holes therein, including the hole side walls, is coated with a relatively thin metal layer in a manner known per se, for example by sputtering or vapor deposition and the plate side under whose surface insulating ring zones are to be generated is coated with a layer of a negative dry resist (photofoil) in such a manner that portions of the resist layer penetrate into the through-holes. Subsequently, the resist portions in the holes are irradiated with ultraviolet light directed through the holes from the opposite side of the plate (i.e., the non-resist coated side) and, optionally, a further resist layer is applied to the plate side which has not yet been resist coated. Next, the resist layer or layers are irradiated with ultraviolet light through an appropriate mask aligned relative to the through-hole pattern so as to define areas for electrodes on one or both sides of the plate and the non-irradiated resist areas are stripped with a suitable developer solution. Finally, a metal layer is galvanically precipitated on all uncovered metal surface areas, remaining resist areas are removed and the so-uncovered metal areas located below the just removed resist areas are selectively etched-off to define electrodes.

In addition to the precision and certainty provided by the principles of the invention, a further advantage is that only one type of resist, namely negative dry resist, is required for the photoprinting steps and processing of negative dry resist is far less work-intensive than that for liquid photoresists.

In accordance with further principles of the invention, the amount of resist penetrating into the through-holes can be controlled by means of available manipulative variables. In this regard, the following manipulative variables are included:

I Surface relationship of through-hole orifice cross-section to metalized glass at the plate surface;

II Type of resist utilized;

III Thickness of applied resist layer;

IV Temperature of laminating drum used to apply resist;

V Laminating rate for applying resist (heat transfer);

VI Pressure exerted by laminating drum in applying resist; and

VII Temperature of the plate during resist application.

In practice, variables I, II and III are constant as a result of plate geometry and the selected resist while variables V and VI are also frequently constant as device parameters so that the amount of resist penetrating into a through-hole orifice area is determined by selection of lamination and plate temperatures, i.e. by control of variables IV and VII.

It is important for later electroplating that the resist lies tightly against the through-hole side walls. In the practice of the invention, this is attained by heating the plate directly before application of the dry resist (for example, up to about 130° C.) or by subjecting the resist-coated plate to a post-tempering (for example at about 130° C. for about 1 minute). In both embodiments, the resist is briefly liquified so that its surface configuration at least in the through-holes changes in comparison to resists which are cold-applied.

Generally, with the methods described heretofore, the insulating areas extend up to the plane of the through-hole orifice. The extent or height dimension of ring insulators is determined by penetration depth of the applied resist into the through-holes. Since this amount varies on a given plate, for example, in the through-hole pattern proper and at edges of the pattern and can also vary somewhat from plate to plate, it can be necessary or desirable that the ring insulator height or extent be produced with greater uniformity. It can also be necessary or desirable that the ring insulator does not extend up to or include the orifice of the through-holes. For example, this can be the case when the ridges or land areas between adjacent through-holes are so narrow that the width of conductor leads disposed row-wise or column-wise over the through-holes approximately corresponds to the diameter of the through-holes. In such instances, a portion of the through-hole wall must also be included in the conductor lead because the lead cross-section would otherwise be too greatly constricted.

Accordingly, with certain embodiments of the invention, it is possible, on one hand to keep the amount of resist introduced into the through-holes identical over the actual through-hole pattern as well as at the edges of the pattern and, on the other hand to displace or position the insulating ring zones entirely within the through-holes while maintaining the height of such zones precisely constant. In these embodiments of the invention, the foregoing occurs by stripping-off the transparent protective film, dry resist layers are usually supplied with and thereafter post-tempering the resist-coated plate. The advantage of this step is that the heated resist can now uniformly enter into the through-holes at all areas of the plate. Further, the shape or configuration of the resist surface is now only produced as a result of the resist surface tension at the lowest occurring viscosity. In addition, this feature ensures that the applied resist, as regards it thickness at the surface, achieves the greatest possible penetration depth into the through-holes because a concave resist surface is formed over such through-holes.

In the practice of the invention, the irradiation of the resist in the through-holes is carried out from the non-laminated side of the plate as a controlled exposure. The selected amount of UV energy is insufficient to harden all the resist through its entire thickness, but only a controlled portion which is closer to the UV source and thereby determines the height of the insulating zone. Portions of the resist being at and over the hole orifice remain soluble in the developer.

In certain preferred embodiments of the invention, prior to galvanic precipitation of metal, the partially processed plates are immersed into an electrolytic solution within a low or negative pressure (sub-atmospheric) chamber. The actual electroplating itself occurs at ambient pressure. By proceeding in this manner, the electrolyte can more easily and uniformly penetrate into the through-holes.

BRIEF DESCRIPTION OF THE DRAWINGS

FIGS. 1a through 1e are enlarged, elevated, somewhat schematic views, partially in cross-section of a through-hole having a single-sided constriction and undergoing various processing steps in accordance with the principles of the invention; and FIGS. 2, 3 and 4 are somewhat similar views illustrating other aspects of the invention.

DESCRIPTION OF PREFERRED EMBODIMENTS

Throughout the drawings, like reference numerals refer to like elements.

Referring now to FIG. 1a, a multitude of through-holes 11 (only one of which is shown) are provided in a select pattern in a plate or work piece 1, which for example, may consist of photoform glass having a thickness of 1 mm. The through-holes 11 are produced in the work piece 1 in a known manner by means of single-sided or double-sided etching and can have a desired geometric cross-section, for example round, oval or polygonal.

The entire surface of work piece 1, including hole walls 11a is first coated with a relatively thin metal layer 2 in a manner known per se, for example by sputtering or vapor deposition. A first or upper work piece surface 1a, under which an insulating ring zone is to be generated, is coated or laminated with a layer 3 of a negative dry resist (photofoil) in such a manner that a portion of the resist layer penetrates into the through-hole, as illustrated. The thin protective film 4, all dry resists 3 available today are provided with, is removed before development of the resist.

The amount of resist which penetrates into the through-holes depends upon the early discussed manipulative variable I-VII and this amount can be reproducibly controlled by means of such manipulative variables. As a general rule, the amount of resist which penetrates into a through-hole space is determined by a select laminating and plate temperature. A comparison of the resist thickness s remaining on surface 1a with the original thickness shows the amount of resist accepted by a through-hole. The penetration depth h of the resist can be calculated over a ratio of hole cross-section to the metalized surface. It is important for a later electroplating (galvanic precipitation) step that the applied resist layer lies tightly against the hole walls. This is achieved by either heating the work piece or plate 1 (for example, to about 130° C.) directly before laminating the resist photofoil onto the heated plate or by post-tempering the resist-coated plate (for example at about 130° C. for about 1 minute). In both instances, the resist is briefly liquified so that its surface shape in the through-holes changes in comparison to cold-coated plates (see the lower portion of the resist within the through-hole in FIGS. 1a and 1b).

After the first step (FIG. 1a) either the protective film 4 can remain on the resist (FIGS. 1a–1c) or it can be removed before the post-tempering so as to provide a more uniform and greater penetration of the depth of the resist into the through-holes (see FIG. 2).

Referring now to FIG. 1b, the resist portions 3a within the through-holes are irradiated with ultraviolet light 5, which is directed through the through-holes from a second or lower surface 1b located opposite the first surface 1a of plate 1, so as to define the area for the insulating rings R. As will be noted, a mask is not required for this purposes because the function of a mask is assumed by the plate itself.

Referring to now FIG. 1c, in the next step, which is optional, a dry negative resist layer 3' is applied onto plate surface 1b. In this step, the laminating parameters can be selected in such a manner that only a small amount of resist penetrates into the through-holes, as shown. The amount of resist penetrating is not significant because any penetrated resist is removed during subsequent development. Next, in order to define areas for desired electrodes on opposite sides of work piece 1, both the upper and lower resist layers 3 and 3' are irradiated with ultraviolet light 5 through appropriate mask 6 and 6a having a pattern of conductors aligned relative to the pattern of through-holes.

In instances where only plate surface 1a, located above the insulating ring zones, is to be provided with discrete electrodes and the opposite surface 1b is to be metalized over its entirety (to define a potential plate), then the application of the lower resist layer 3' is omitted.

Referring to FIG. 1d, after exposure of the resist layer 3 and removal of the protective film 4, the non-irradiated resist areas are stripped-off with a compatible developer solution to leave hardened resist areas 3b. Subsequently, a metal layer 7 is galvanically precipitated on exposed areas of metal layer 2. In order to ensure that the electrolyte penetrates into the through-holes, the immersion of the thus-far process plate occurs in a low-pressure chamber from which air has been largely evacuated. Finally, the remaining resist areas 3b are removed and the so-uncovered areas of metal layer 2 located below the just-removed resist areas are selectively etched-off to define electrodes 7 as shown in FIG. 1e. The diameter D, of an insulating ring zone is indicated at FIG. 1d.

In embodiments of the invention where the insulating ring zone R is located entirely within a through-hole (i.e., below surface 1a of the plate) and the height of zone R is produced exactly constant with the aid of controlled exposure time, an intermediate structure shown at FIG. 3 results (instead of the intermediate structure shown at FIG. 1d) and the finished structure is shown at FIG. 4 (instead of that shown FIG. 1e). As can be seen from FIG. 3, the insulating ring zone R does not extend up to the plane of the through-hole orifice and instead is located below this plane and completely within the through-hole. The height of the insulating ring zone R is designated H in FIGS. 3 and 4. By practicing the principles of the invention as relates to this embodiment, a substantial uniformity of insulating ring zone heighth is achieved throughout all the through-holes in a plate.

Although the through-holes have been illustrated as being conically shaped in the various Figures, the principles of the invention also apply to other through-hole shapes, such as, for example, cylindrical or double-conical shapes.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. A method for structuring insulating ring zones by galvanic and etch techniques at respective orifice areas of through-holes in plates, comprising:
    (a) applying a relatively thin metal layer onto all surfaces of a plate having a select pattern of through-holes therein, including on side walls of said through-holes;
    (b) laminating a negative dry resist layer onto a first surface of said plate, under which insulating ring zones are to be generated, in such a manner that a portion of the resist layer penetrates into the respective through-hole orifices;
    (c) irradiating the resist layer portions within the through-hole orifices with ultraviolet light directed through said holes from a second surface of said plate located opposite said first surface thereof;
    (d) applying a dry resist layer to said second surface of said plate;
    (e) irradiating said resist layers on the first and second surfaces of said plate through masks aligned relative to said through-holes so as to define areas for electrodes on both of said plate surfaces and stripping-off non-irradiated resist areas in a developer solution; and
    (f) galvanically precipitating a metal layer onto all uncovered thin metal layer areas, removing remaining resist layers and selectively etching-off uncovered thin metal layer areas positioned below the just removed resist area so as to define electrodes.

2. A method as defined in claim 1 wherein the amount of resist layer penetrating into the respective through-hole orifices during step (b) is controlled by means of available manipulative variables.

3. A method as defined in claim 1 wherein said plate is heated-up directly prior to step (b).

4. A method as defined in claim 1 wherein said plate is heated-up directly after step (b).

5. A method as defined in claim 1 wherein a protective transparent film provided on the upper surface of the negative dry resist layer, is removed after laminating the negative dry resist layer, under which the insulating ring zones are to be generated and before irradiating said resist layer.

6. A method as defined in claim 1 wherein irridation during step (c) occurs over a select time period adequate to ensure that resist layer areas over the through-hole orifices are non-errodable in said developer solution.

7. A method as defined in claim 1 wherein irridation during step (c) occurs over a select time period adequate to render the resist layer areas adjacent and over the through-hole orifices errodable in said developer solution.

8. A method as defined in claim 1 wherein during step (f) the processed plate is immersed into an electrolyte bath in a negative-pressure chamber and the galvanic precipitation itself occurs at ambient pressure.

9. A method of producing insulating ring zones by galvanic and etched technologies at respective orifice areas of through-holes in a plate, comprising:
    applying a relatively thin metal layer onto all surfaces of a plate having a select pattern of through-holes therein, including on side walls of said through-holes;
    applying a layer of a dry negative resist onto a first surface of said plate, underwhich insulating ring zones are to be generated within respective through-hole orifices, in such a manner that a portion of said resist layer penetrates into the respective through-hole orifices;
    irridiating said resist layer portions within said through-hole orifices with ultraviolet light directed through the respective holes from a second surface of said plate located opposite said first surface thereof;
    irradiating said resist layer on said first surface of said plate through a mask having a select pattern of windows therein aligned relative to said through-holes so as to define areas on said plates for electrodes and removing non-irradiated resist layers areas with a compatible developer; and
    galvanically precipitating a metal layer onto all uncovered thin metal layers areas, removing remaining resist layer areas on said plate and selectively etching-off uncovered thin metal layer areas located below the just removed resist areas so as to define electrodes.

* * * * *